United States Patent
Tsujimura et al.

(10) Patent No.: US 8,344,268 B2
(45) Date of Patent: Jan. 1, 2013

(54) ELECTRONIC COMPONENT PACKAGING STRUCTURE HAVING TWO-LAYER MOISTURE-PROOF COATING AND METHOD FOR MANUFACTURING THE SAME

(75) Inventors: Hideyuki Tsujimura, Kyoto (JP); Hidenori Miyakawa, Osaka (JP); Atsushi Yamaguchi, Osaka (JP); Hiroe Kowada, Osaka (JP); Koso Matsuno, Osaka (JP)

(73) Assignee: Panasonic Corporation, Osaka (JP)

( * ) Notice: Subject to any disclaimer, the term of this patent is extended or adjusted under 35 U.S.C. 154(b) by 636 days.

(21) Appl. No.: 12/496,017

(22) Filed: Jul. 1, 2009

(65) Prior Publication Data

US 2010/0002401 A1    Jan. 7, 2010

(30) Foreign Application Priority Data

Jul. 2, 2008  (JP) ................................ 2008-173364

(51) Int. Cl.
*H05K 1/11* (2006.01)

(52) U.S. Cl. .......................... 174/262; 174/260; 257/790

(58) Field of Classification Search .................. 174/260, 174/262–266; 257/787–796
See application file for complete search history.

(56) References Cited

U.S. PATENT DOCUMENTS

| 4,163,072 A * | 7/1979 | Soos ........................... 427/96.3 |
| 5,445,873 A | 8/1995 | Yaginuma et al. |

FOREIGN PATENT DOCUMENTS

| JP | 7-173435 | 7/1995 |
| JP | 2000-327921 | 11/2000 |
| JP | 2001-168501 | 6/2001 |

* cited by examiner

*Primary Examiner* — Jeremy Norris
(74) *Attorney, Agent, or Firm* — Wenderoth, Lind & Ponack, L.L.P.

(57) ABSTRACT

An electronic component packaging structure includes a circuit board, electronic components mounted on the circuit board and a moisture-proof coating layer covering the electronic components. The moisture-proof coating layer is constituted from a polymer material coating having at least two layers of a lower layer and an upper layer, and the polymer material forming the lower layer has higher swelling property and/or solubility to a repairing solvent that is selected from among hydrocarbon-based solvents than the polymer material forming the upper layer.

7 Claims, 2 Drawing Sheets

ELECTRONIC COMPONENT PACKAGING STRUCTURE HAVING TWO-LAYER MOISTURE-PROOF COATING AND METHOD FOR MANUFACTURING THE SAME

BACKGROUND OF THE INVENTION

1. Field of the Invention

The present invention relates to an electronic component packaging structure provided with a moisture-proof coating. In particularly, the present invention relates to an electronic component packaging structure that is covered on the surface thereof by a moisture-proof coating layer protecting the electronic components after completion, while the moisture-proof coating layer can be easily peeled off during repairing.

2. Description of the Related Art

In recent years, there has been a trend toward the use of expensive electronic components on circuit boards used in electric systems of automobiles and aircraft, as electronic apparatuses are required to have increasingly higher performance, higher functions and higher degree of integration. Moreover, the electric systems are required to have high reliability and high durability against harsh operating environment including high temperature, high humidity, watering, dust and vibration. To meet such requirements, such circuit boards provided with moisture-proof coating are used as electronic components including semiconductor devices are covered by a coating material (refer to Japanese Patent Publications JP07-173435A and JP2001-168501A).

On such circuit boards, too, very expensive electronic components have come to be used in large quantities, in an attempt to achieve higher performance, higher functions and higher degree of integration. In case a defect is found in part of the circuit board after mounting the electronic components on the circuit board, repairing operation is often carried out by removing the defective electronic component from the circuit board and reusing functional electronic components.

To repair an electronic component packaging structure that is covered on the surface by a moisture-proof coating layer, it is necessary to peel off the moisture-proof coating layer from the electronic component packaging structure or dissolve the moisture-proof coating layer with an appropriate solvent, then heat the circuit board partially to the solder melting temperature and remove the electronic component. For the moisture-proof coating layer, polymer materials such as acrylic resin and silicone resin (refer to Japanese Patent Publication JP2000-327921A) are commonly used. When repairing, such a polymer material is removed by peeling off the polymer material sheet while heating, dissolving the polymer material with an organic solvent that can dissolve the polymer material, or peeling off the polymer material that has been caused to swell somewhat by putting it into contact an organic solvent that can cause the polymer material to swell.

When repairing an electronic component packaging structure where a polymer material of silicone resin is used as the moisture-proof coating layer, it is a common practice to cause the moisture-proof coating layer to swell by means of an organic solvent such as alcohol or ketone, then peel off the moisture-proof coating layer from the circuit board. In this case, the polymer material of silicone resin tends to rupture along the surface as it is unable to maintain the form of layer or sheet that extends over the surface of the circuit board. As a result, the polymer material of the moisture-proof coating layer remains stuck onto the circuit board in the form of relatively small pieces of scraps. To remove the polymer material of the moisture-proof coating layer remaining in such a form from the circuit board, it has been required to manually peel off each piece by means of a tool such as tweezers. It takes much time and labor to remove the polymer material of the moisture-proof coating layer completely from the circuit board by such a manual operation.

SUMMARY OF THE INVENTION

The present invention aims at solving the known problems described above. An object of the present invention is to provide an electronic component packaging structure having, as the moisture-proof coating layer, a polymer material that is capable of performing sufficient functions as the moisture-proof coating layer and can be relatively easily peeled off from a circuit board when repairing.

Another object of the present invention is to provide a method for manufacturing the electronic components packaging structure.

The present invention provides an electronic component packaging structure comprising a circuit board, electronic components mounted on the circuit board and a moisture-proof coating layer that covers the electronic components, wherein the moisture-proof coating layer is constituted from a polymer material coating having at least two layers of a lower layer and an upper layer, and the polymer material that forms the lower layer has higher swelling property and/or solubility to a repairing solvent that is selected from among hydrocarbon-based solvents than the polymer material that forms the upper layer has.

According to the present invention, it is made possible to provide the electronic component packaging structure having, as the moisture-proof coating layer, a polymer material that has sufficient moisture-proof performance and can be relatively easily peeled off from a circuit board and/or electronic components when repairing.

DETAILED DESCRIPTION OF THE INVENTION

Figure 1:
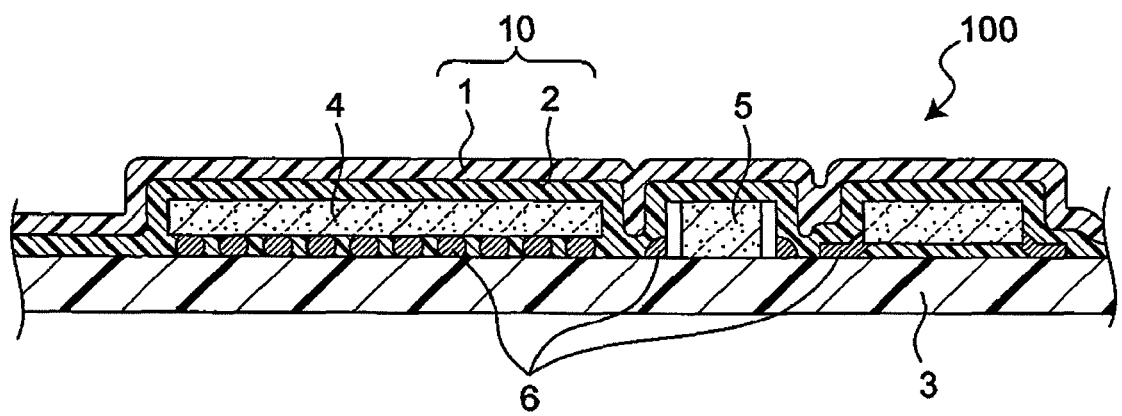
FIG. 1 is a sectional view showing an electronic component packaging structure 100 according to a first embodiment of the present invention.

Embodiments of the present invention will be described in detail with reference to the accompanying drawings. In the description that follows, while terms that represent particular directions and positions (such as upper, lower, right, left and other expressions including some of these terms) will be used as required, these terms are used merely for the purpose of making it easier to understand the present invention with reference to the accompanying drawings, and are not intended to restrict the scope of the present invention by the meanings of these terms and expressions. Identical reference numeral used in plural drawings represents an identical part or member.

(1) First Embodiment

FIG. 1 is a sectional view showing the electronic component packaging structure 100 of the present invention.

The electronic component packaging structure 100 of the present invention comprises a circuit board 3, semiconductor devices 4 and electronic components 5 (electronic components other than the semiconductor device 4) such as chip resistors mounted on the circuit board 3 by means of, for example, a solder 6, and a moisture-proof coating layer 10 covering the semiconductor devices 4 and the electronic components 5, wherein the moisture-proof coating layer 10 is constituted from a polymer material coating having at least two layers of a lower layer 2 and an upper layer 1, and the polymer material forming the lower layer 2 has higher swelling property and/or solubility to a repairing solvent that is selected from among hydrocarbon-based solvents than the polymer material that forms the upper layer 1 has.

According to the present invention, the moisture-proof coating layer 10 is formed from at least two layers of polymer material coating including a moisture-proof coating layer provided on the lower side (lower layer 2) and a moisture-proof coating layer provided on the upper side (upper layer 1). Selection of the repairing solvent and the polymer materials of the two layers is made in accordance to the relationship between the physical properties of these materials. Basically it is preferable that the polymer material forming the upper layer 1 does not exhibit solubility to the repairing solvent and shows low tendency of swelling, should it swells. In case there is a possibility of making contact with moisture or the like, in particular, the polymer material is required to remain without being denatured. The polymer material forming the lower layer 2 is required to show higher swelling property and/or solubility to the repairing solvent than the polymer material forming the upper layer 1. It is also preferable that the polymer material of the lower layer 2 shows higher affinity or adhesiveness to the polymer material of the upper layer 1 than it shows to the circuit board 3 and/or the electronic components (the semiconductor devices 4 and the electronic components 5) in the state of being cured to form the layer.

The moisture-proof coating layer 10, formed in such a constitution as described above, is capable of performing sufficient moisture-proof function when the electronic component packaging structure 100 is used for the intended application. Also when it is attempted to repair the electronic component packaging structure 100, since the polymer material of the lower layer 2 shows higher swelling property and/or solubility to the repairing solvent selected than the polymer material of the upper layer 1 shows, when the moisture-proof coating layer 10 is put into contact with the repairing solvent, the polymer material of the lower layer 2 can be caused to rupture along the surface of the circuit board 3 in the form of relatively small pieces of scraps, while the polymer material of the upper layer 1 remains in the form of layer or sheet that extends over the circuit board surface.

Since the polymer material of the lower layer 2 shows higher affinity to and more firmly sticks to the polymer material of the upper layer 1 than it shows to the circuit board 3 and/or the electronic components (the semiconductor devices 4 and the electronic components 5), the moisture-proof coating layer 10 can be relatively easily removed as a whole from the circuit board 3 by peeling off the polymer material of the upper layer 1 that maintains the form of layer or sheet extending over the circuit board 3, while the polymer material of the lower layer 2 remains in the form of broken pieces adhered onto the polymer material of the upper layer 1.

There is no restriction on the polymer material used to form the moisture-proof coating layer 10 in the electronic component packaging structure 100 of the present invention, which may be selected from among a group consisting of urethane resin, acrylic resin, silicone resin, rubber-base resin, polyether resin and epoxy resin.

In case different kinds of resin are used as the polymer materials of the lower layer 2 and the upper layer 1, such a structure may be employed as the upper layer 1 is adhered onto the lower layer 2 by selecting resins that have such properties as the lower layer 2 is caused to swell to a higher extent by the repairing solvent in use than the upper layer 1 is. The layers can be adhered to each other by an operation of coating the circuit board 3, whereon the electronic components (the semiconductor devices 4 and the electronic components 5) have been mounted, with the material of the lower layer 2, curing the material, coating the lower layer 2 on the surface thereof with the material of the upper layer 1 and curing the material, an operation of applying the material of the lower layer 2 to the circuit board 3, whereon the electronic components, coating the surface of the lower layer 2 with the material of the upper layer 1, curing the material of the lower layer 2, and curing the material of the upper layer 1, or an operation of applying the material of the lower layer 2 to the circuit board 3, whereon the electronic components, coating the surface of the lower layer 2 with the material of the upper layer 1, and curing the material of the lower layer 2 and the material of the upper layer 1 at the same time. There is no restriction on the applying process, and such processes may be employed as the ordinary spraying or printing process, and dispensing process may be used for partial application.

Alternatively, the moisture-proof coating layer 10 may be constituted from two layers of the lower layer 2 and the upper layer 1 that are formed from the same kind of resin. In this case, how much the resins would be caused to swell by the repairing solvent can be differentiated by such measures as using the polymer material of the lower layer 2 and the polymer material of the upper layer 1 that have different molecular weights, using the polymer materials that are cured differently, or differentiating the degree of crosslinking between the polymer materials when cured. Among resins of the same kind, one that has greater molecular weight, higher tendency to cure or higher degree of crosslinking has lower tendency to swell and/or solubility to the repairing solvent.

Accordingly, the electronic component packaging structure 100 according to one aspect of the present invention is characterized in that molecular weight ($M_{WB}$) of the polymer material forming the lower layer 2 and molecular weight ($M_{WA}$) of the polymer material forming the upper layer 1 satisfy the following relationship:

$$M_{WB} < M_{WA}$$

When two kinds of polymer material that have different molecular weights are used, for example in case acrylic resin is selected, one having a molecular weight of 100 to 10,000 may be used as the polymer material of the lower layer 2 and one having a molecular weight of 10,000 or more may be used as the polymer material of the upper layer 1. The larger the difference in molecular weight, the clearer the difference in the extent of swelling becomes between the resins in response to the repairing solvent. Thus it is preferable to use one for the polymer material of the lower layer 2 that has a molecular weight 10 to 100 times as large as that of the polymer material of the upper layer 1. For example, it is preferable to use an acrylic resin that has a molecular weight of 1,000 to 2,000 for the polymer material of the lower layer 2 and use an acrylic resin that has a molecular weight of 100,000 or more for the polymer material of the upper layer 1.

The molecular weight can be increased by forming an oxirane ring (an epoxy group) at the end of an acrylic resin polymer and causing the ring to react so as to form crosslink. Such an acrylic resin may also be used as the polymer material of the upper layer 1.

In case a thermocurable resin is used as the polymer material of the moisture-proof coating layer 10, the moisture-proof coating layer 10 of a two-layer structure can be formed by applying the thermocurable resin that has not cured onto the circuit board 3 only once, instead of applying in two runs. This is carried out by heating the entire thermocurable resin that has been applied onto the circuit board 3 and not yet cured, so as to cure to an extent of about 50% of full cured state, and then blow high-temperature air (for example, an air stream of a temperature about 10 to 50° C. higher than the curing temperature of the thermocurable resin) onto the surface of the thermocurable resin so as to accelerate the curing reaction of the thermocurable resin on the surface region (or the portion near the surface).

The method described above makes it possible to halt the curing process of the lower portion of the thermocurable resin to about 50% of full cured state by heating the entire coat, and accelerate the curing of the near-surface portion of the thermocurable resin, that is put into contact with the high-temperature air, to an extent in a range from 55 to 100%. As a result, the moisture-proof coating layer 10 can be formed in such a constitution that is divided into roughly two parts of the upper layer 1 (or surface layer) located at the top that has cured to a higher degree and the lower layer 2 (or inner layer) located at the bottom that has cured to a lower degree. As a result, the upper layer 1 can be formed with a larger molecular weight than that of the lower layer 2. In general, the molecular weight can be determined by gel permeation chromatography (GPC) using polystyrene standards.

Alternatively a radiation-curable resin may be used as the polymer material that forms the moisture-proof coating layer 10 having a two-layer structure. The polymer materials used in the two layers may be or may not be the same kind of resin. It is preferable that, after curing, the lower layer 2 is cured to a lower degree than the upper layer 1. Thus the electronic component packaging structure 100 of the present invention, in one aspect, is characterized in that the polymer material used to form the lower layer 2 is cured to a lower degree than that of the polymer material used to form the upper layer 1.

The electronic component packaging structure 100 of the present invention is characterized in that a radiation-curable resin is used as the polymer materials for forming the lower layer 2 and the upper layer 1, that the radiation-curable resin contains a filler that blocks the radiation, and that filler density $F_B$ of the lower layer 2 is higher than filler density $F_A$ of the upper layer 1.

In the invention that employs the radiation-curable resin, various kinds of irradiated radiation such as ultraviolet ray or electron beam may be used as the radiation.

According to the present invention, as filler density $F_B$ of the lower layer 2 is set higher than filler density $F_A$ of the upper layer 1, even when the lower layer 2 and the upper layer 1 are irradiated simultaneously from the same source, irradiation dose which the lower layer 2 is capable of absorbing can be made less than the irradiation dose which the upper layer 1 is capable of absorbing, because the filler density $F_B$ of the lower layer 2 is relatively higher. This constitution enables it to set the degree of curing of the polymer material of the lower layer 2 lower than the degree of curing of the polymer material of the upper layer 1. In the present invention, filler density means volume density of the filler. Volume density of the filler is represented by the proportion of the volume of filler to unit volume of the resin containing the filler, and is given as volume density (%)=(volume of filler)/(volume of filler+volume of resin)×100.

In case an ultraviolet-curable resin is used as the main component of the polymer material, a monomer of a hydrocarbon compound that has at least one polymerizable ethylenically unsaturated bond in the molecule may be used, such as dicyclopentenyl oxyethyl acrylate, dicyclopentenyl acrylate, urethane acrylate, or epoxy acrylate. The resin compound to be applied is constituted to contain one or more monomers, a photopolymerization initiator and a specific aminosilane compound. The molecular weight or crosslink density of the resultant polymer can be controlled by adding a filler that blocks ultraviolet ray to the compound described above. Dose of ultraviolet radiation can also be controlled.

The electronic component packaging structure 100 of the present invention may also be characterized in that the filler density $F_B$ of the lower layer 2 and the filler density $F_A$ of the upper layer 1 satisfy a relationship of $(F_B-F_A)>5$, and that mean filler density $((F_B+F_A)/2)$ is less than 50% by weight relative to the weight of the resin compound to be applied.

Filler density higher than 50% diminishes the difference in the effect of the filler to block the radiation (particularly ultraviolet ray), and is not desirable. It is preferable to control the difference in filler density $(F_B-F_A)$ to 10% or more, since it increases the influence of the radiation (particularly ultraviolet ray) that is blocked in the lower layer 2, so that the degree of crosslinking in the lower layer 2 can be made lower than the degree of crosslinking in the upper layer 1, thereby generating clear difference in the crosslink structure of the polymer material between the lower layer 2 and the upper layer 1.

Fillers that can be preferably used to block the radiation (particularly ultraviolet ray) are inorganic insulating fillers commonly used, such as silicon dioxide, titanium dioxide and aluminum oxide (alumina). While there is no restriction on the shape of the filler particles which may be spherical, flakes, as crushed or other shape, it is preferable to use the filler as crushed which causes scattering of the ultraviolet rays due to random reflection.

Mean particle size of the filler is preferably not less than 10 μm, so as to contain the filler with a higher density in the lower portion (namely the lower layer 2) that is nearer to the circuit board 3, the semiconductor devices 4 and The electronic components 5, than in the portion near to the surface of the moisture-proof coating layer 10 (namely the upper layer 1). This makes it possible for larger particles of the filler to sediment by gravity in the polymer material that has been applied to the circuit board 3 and has not cured yet. When the mean particle size of the filler is more than 50 μm, sufficient effect of blocking ultraviolet ray may not be achieved since the number of filler particles contained in the layer decreases. Thus, the mean particle size of the filler is in a range from 10 to 100 μm, preferably from 10 to 50 μm, and more preferably from 10 to 30 μm.

The repairing solvent is selected in combination with the polymer materials of the lower layer 2 and the upper layer 1, since it is important to cause the polymer material of the lower layer 2 to swell or dissolve while keeping the polymer material of the upper layer 1 from substantially swelling. For the repairing solvent, it is preferable to use an organic solvent having a low boiling point. For example, the polymer material of the lower layer 2 and the repairing solvent may be such combinations as an acrylic resin and a ketone solvent, a urethane resin and a nitrogen-containing solvent, a silicone resin or a rubber-based resin and an acrylic acid-based solvent such as acrylonitrile, and a polyether resin or an epoxy resin and a glycoldiether-based solvent. In case such a combination is used, a urethane resin or a silicone resin may be used for the polymer material of the upper layer 1 when the lower layer 2 is formed from acrylic resin, and urethane resin may be used when the lower layer 2 is formed from an epoxy resin. These solvents may be used either individually or in a combination of two or more kinds thereof. Part of the solvent may be replaced with a hydrocarbon-based solvent, an ester-based solvent, a polyhydric alcohol derivative or the like to such an extent that does not hamper swelling property or solubility of the polymer material of the lower layer 2 used for the purpose of bonding.

There is no restriction on the ketone-based solvent and, for example, methyl ethyl ketone (MEK), diethyl ketone, methyl-n-butyl ketone, methyl isobutyl ketone (MIBK), methyl n-propyl ketone, di-n-propyl ketone, dicyclohexanone, acetophenone or the like may be used either individually or in a combination of two or more kinds thereof. Among these, methyl ethyl ketone (MEK), methyl isobutyl ketone (MIBK), dicyclohexanone and acetophenone are preferably used for the reason of capability to increase the evaporation rate.

There is no restriction on the glycoldiether-based solvent and, for example, ethylene glycol dimethyl ether, diethylene glycol dimethyl ether, triethylene glycol dimethyl ether or the like may be used either individually or in a combination of two or more kinds thereof.

There is no restriction on the nitrogen-containing solvent and, for example, N,N'-dimethylformamide (DMF), N,N'-dimethylacetamide, N-methyl-2-pyrrolidone, N,N'-dimethyl sulfoxide, hexamethylphosphortriamide or the like may be used either individually or in a combination of two or more kinds thereof.

There is no restriction on the hydrocarbon-based solvent and, for example, toluene, xylene or the like may be used, but are not preferable for the reason of impact on the environment.

There is no restriction on the ester-based solvent and, for example, ethyl acetate, butyl acetate or the like may be used. There is no restriction on the polyhydric alcohol derivative, for example, propylene glycol monomethylether acetate or the like may be used either individually or in a combination of two or more kinds.

(2) Second Embodiment

Figure 2:
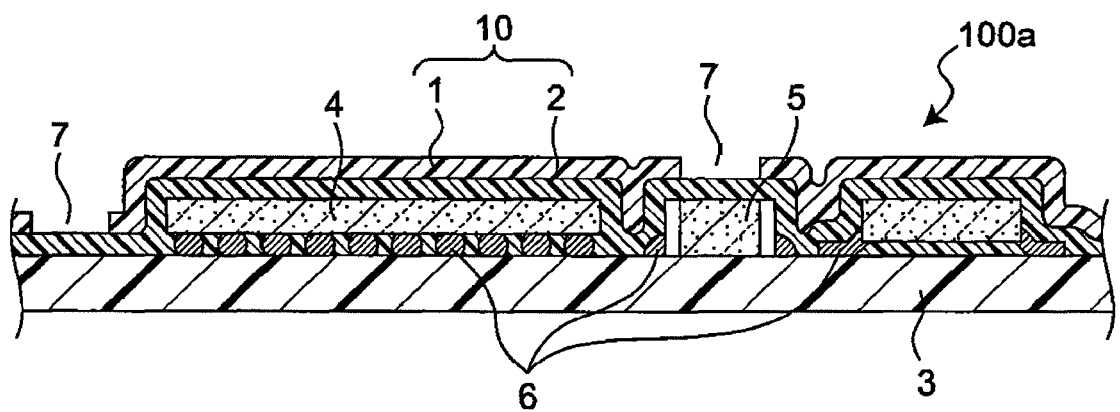
FIG. 2 is a sectional view showing an electronic component packaging structure 100a according to a second embodiment of the present invention.

FIG. 2 is a sectional view showing the electronic component packaging structure 100a according to the second embodiment of the present invention. The electronic component packaging structure 100a has through hole 7 that penetrates the upper layer 1 in the direction of thickness thereof, so that a part of the lower layer 2 is exposed. During repairing operation, the repairing solvent passes the through hole 7 so that the polymer material of the lower layer 2 can be contact with the repairing solvent more quickly.

Constitution of the electronic component packaging structure 100a is the same as that of the electronic component packaging structure 100 of the first embodiment with other respect.

The diameter of the through hole 7 can be arbitrarily set. With regard to the number of the through holes 7, one or more thereof may be provided at arbitrarily selected positions over the surface of the upper layer 1.

The diameter (opening size) of the through hole 7 is preferably in a range from 0.1 to 3 mm. When the diameter is less than 0.1 mm, the polymer material of the upper layer 1 in liquid form may block the hole during manufacturing, thus making it impossible to achieve the precise diameter stably. When the diameter is larger than 3 mm, area of portion of the moisture-proof coating layer 10 where the upper layer 1 is not provided increases, thus resulting in lower insulation resistance.

The through holes 7 are preferably formed in the upper layer 1 at predetermined intervals of, for example, 0.5 to 30 mm, since this enables it to swell or dissolve the lower layer 2 as a whole more uniformly during repairing.

The through holes 7 can be formed by covering portions of the lower layer 2 on the surface thereof with a mask so that the portions would not be coated with the material of the upper layer 1, when forming the upper layer 1 on the lower layer 2.

In case the through hole 7 is not formed in the upper layer 1 of the moisture-proof coating layer 10 in advance and the entire lower layer 2 is covered by the upper layer 1 that has lower swelling property and/or solubility to the repairing solvent, the upper layer 1 may significantly delay the repairing solvent in infiltrating or reaching the lower layer 2 during repairing operation.

The upper layer 1 may be made permeable to the repairing solvent by slashing the upper layer 1 by means of a sharp tool such as a knife. However, slashing the upper layer 1 by means of a sharp tool so as to reach the lower layer 2 may cause damage to the semiconductor devices 4 or the electronic components 5 that are provided right below the lower layer 2. With this regard, this embodiment is advantageous in that the repairing solvent can be caused to easily and quickly reach the lower layer 2 so that the repairing operation can be carried out relatively quickly without damaging the semiconductor devices 4 and the electronic components 5 to be recovered, in case the through hole 7 is formed in advance to penetrate the upper layer 1 vertically.

(3) Third Embodiment

Figure 3:
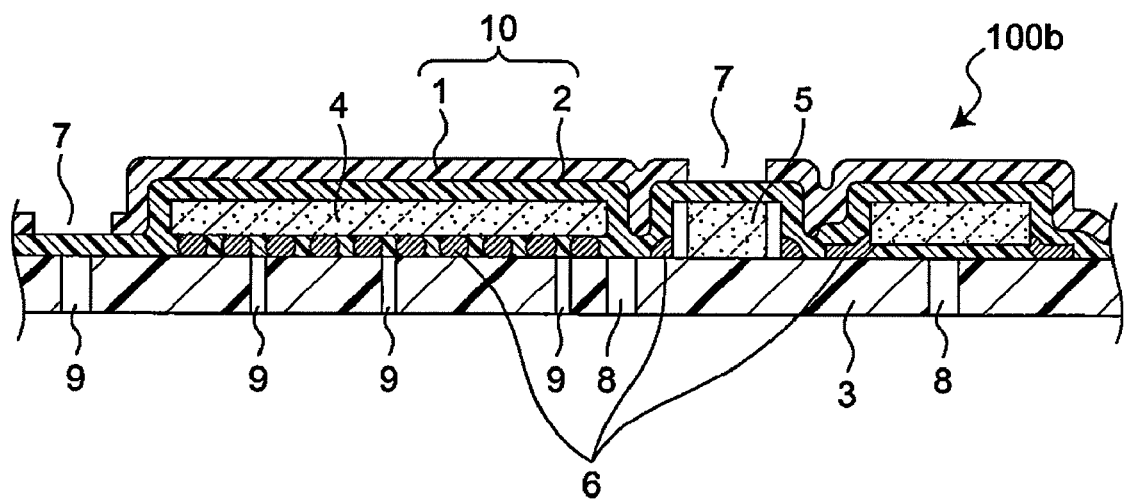
FIG. 3 is a sectional view showing an electronic component packaging structure 100b according to a third embodiment of the present invention.

FIG. 3 is a sectional view showing the electronic component packaging structure 100b according to the third embodiment of the present invention.

In the electronic component packaging structure 10b, the circuit board 3 has passing hole 8 in addition to the electronic component packaging structure 100a described above. The passing hole 8 penetrates the circuit board 3 from one surface thereof (the lower surface in FIG. 3) to the other surface (the upper surface, whereon the semiconductor devices 4 and/or the electronic components 5 are mounted in FIG. 3). During repairing operation, the repairing solvent passes the passing hole 8 to reach the lower layer 2 so that the polymer material of the lower layer 2 can be put into contact with the repairing solvent more quickly. Constitution of the electronic component packaging structure 100b is the same as that of the electronic component packaging structure 100a of the second embodiment with other respect.

While there is no restriction on the position in the circuit board 3 where the through hole 8 is formed, when electronic components (the semiconductor devices 4 or the electronic components 5) having large footprints (area of projection onto the circuit board 3 when mounted) in a range from 5 to 50 mm$^2$, it is preferable to provide the passing hole 8 below the semiconductor devices 4 or the electronic components 5. This makes it possible to more quickly dissolve or swell the lower layer 2 that covers the semiconductor devices 4 or the electronic components 5, and therefore shorten the time taken to repair the semiconductor devices 4 or the electronic components 5.

While there is no restriction on the diameter of the passing hole 8, the diameter is preferably 0.1 mm or larger. When the diameter is less than 0.1 mm, sufficient quantity of the repairing solvent may not pass the passing hole 8 depending on the type of repairing solvent.

It is preferable to make the passing hole 8 smooth by de-smearing operation so as to allow the repairing solvent pass smoothly therethrough. It is more preferable to control the surface roughness of the inner surface of the passing hole 8 to 50a or less, that is, to control the mean roughness $R_{a75}$ specified in Japan Industrial Standard (JIS B 0601: 2001) to 50 μm or less. In this case, the mean roughness $R_{a75}$ is measured on the inner wall of the passing hole 8 along with the thickness direction of the circuit board 3 under a condition that cutoff value (75%) $\lambda_{0.75}$ is 2 mm and evaluation length in is 1 mm.

Clause 2.4 of Appendix 2 of JIS B 0601: 2001 specifies that the evaluation length in shall be three times of the cutoff value $\lambda_{0.75}$ or more. However, taking account into the thickness of the circuit board 3 and the magnitude of the surface roughness of the inner wall of the passing hole 8, it is appropriate that the mean roughness $R_{a75}$ is measured under the condition that cutoff value $\lambda_{0.75}$ is 2 mm and evaluation length in is 1 mm.

When the thickness of the circuit board 3 is 1.1 mm or less, from the view point of measurement accuracy and physical difficulties, maintaining the 1 mm evaluation length is difficult or impossible. Thus when the thickness of the circuit board 3 is 1.1 mm or less it is appropriate that the evaluation length is set to 80% of the thickness of the circuit board 3.

In this embodiment, in addition to the passing hole 8, or instead of the passing hole 8, through hole 9 may be used to pass the repairing solvent therethrough and put the polymer material of the lower layer 2 into contact with the repairing solvent.

In the present specification, the through hole 9 is provided for the purpose of establishing electrical connection between one surface and the other surface of the circuit board 3 (in case the circuit board 3 is constituted from multiple layers, one layer thereof), and therefore has electricity conducting means provided inside thereof, such as a metallic plating layer formed on the inner surface. The passing hole 8, on the other hand, is provided for the purpose of passing the repairing solvent therethrough, and does not have the function of establishing electrical connection between one surface and the other surface of the circuit board 3. It should be noted, therefore, that the passing hole 8 and the through hole 9 have different purposes.

This embodiment is applicable also to a case where the circuit board 3 comprises a plurality of layers whereon circuits are formed that are placed one on another. Thus the polymer material of the lower layer 2 can be put quickly into contact with the repairing solvent by using the passing hole 8 and/or the through hole 9 that penetrate the multiple-layer circuit board 3.

While the through hole 7 is provided in the upper layer 1 in the embodiment shown in FIG. 3, an embodiment wherein the upper layer 1 does not have the through hole 7 (namely a form where the through hole 8 is added to the electronic component packaging structure 100 of the first embodiment) is naturally included within the scope of this embodiment.

EXAMPLES

Example 1

After supplying a cream solder (L60C manufactured by Senju Metal Industry Co., Ltd.) onto the circuit board 3 by printing process, BGA (23 mm square at 0.8 nm pitch) as the semiconductor device 4 and chip component (1005R) as electronic component 5 were mounted, and the assembly was placed in a reflow furnace. The circuit board 3 having the electronic components (semiconductor device 4 and electronic component 5) mounted thereon was coated with a moisture-proof insulating material for circuit board Tuffy TF-1141H (registered trade mark of acrylic resin manufactured by Hitachi Chemical Co., Ltd.) over the entire surface thereof by spraying and was dried, to form the lower layer 2 having a thickness of 60 μm. Then a moisture-proof insulating material for circuit board Tuffy TF-1154 (registered trade mark of a urethane resin manufactured by Hitachi Chemical Co., Ltd.) was applied over the entire surface of the lower layer by spraying and was dried, to form the upper layer 1 of the moisture-proof coating layer 10 having a thickness of 100 μm, thereby obtaining the electronic component packaging structure 100 provided with the two-layer moisture-proof coating of the Example. When tested under this condition, the BGA and the chip components functioned normally.

100% methyl ethyl ketone (MEK) was used as the repairing solvent for repairing the BGA of the electronic component packaging structure 100 that was obtained as described above. With a vessel having a capacity enough to accommodate the electronic component packaging structure 100 being filled with a sufficient quantity of the repairing solvent, the electronic component packaging structure 100 was immersed in the repairing solvent at the room temperature. After 10 minutes, the electronic component packaging structure 100 was taken out of the repairing solvent. When a part of the moisture-proof coating layer 10 was held with tweezers and lifted, the Tuffy TF-1154 (urethane resin) that constituted the upper layer 1 was peeled off from the electronic components (the semiconductor devices 4 and the electronic components 5) and the circuit board 3 while maintaining the form of sheet without rupturing. While the Tuffy TF-1141H (acrylic resin) that constituted the lower layer 2 ruptured without being capable of maintaining the form of sheet, almost all of the ruptured pieces stuck to the upper layer 1 and could be separated from the semiconductor devices 4, the electronic components 5 and the circuit board 3.

Thus in the electronic component packaging structure 100 having the constitution of the present invention, broken pieces of the lower layer 2 can be stuck to the upper layer 1 without substantially no part thereof left on the electronic component packaging structure and can be separated from the electronic components (semiconductor devices 4 and the electronic components 5) and the circuit board 3, with the upper layer 1 serving as one sheet, by making use of the higher affinity between the polymer material of the lower layer 2 and the polymer material of the upper layer 1 that are formed integrally one on another as the moisture-proof coating layer 10 of the electronic component packaging structure 100, than the affinity between the surface of the circuit board 3 whereon the electronic components (the semiconductor devices 4 and the electronic components 5) are mounted and the polymer material of the lower layer 2. Incidentally, since the upper layer 1 was also weakened somewhat in the tensile strength, operation to peel off had to be done carefully, and took about three minutes.

After peeling off the moisture-proof coating layer 10, the BGA (semiconductor device 4) and the chip component (electronic component 5) remaining on the circuit board 3 were heated by a repairing apparatus (RD-500II manufactured by DEN-ON INSTRUMENTS CO., LTD.) so that temperature of the junctions reached 230° C. or higher, and the BGA and the chip component could be easily removed. As the solder 6 and remnant of the moisture-proof coating layer remained on the circuit board 3 from which the BGA and the chip component had been removed, the remnant of the moisture-proof coating layer was removed by using ethanol, and the solder 6 was removed by means of a soldering iron. Then cream solder was supplied to the leads of new BGA and the components mounted by the repairing apparatus were tested. The BGA normally functioned similarly to that shown after the initial mounting.

Comparative Example 1

Similarly to Example 1, a BGA (23 mm square at 0.8 mm pitch) and chip component (1005R) were mounted on a printed circuit board. The circuit board was coated with moisture-proof insulating material for circuit board Tuffy TF-1141H (registered trade mark of acrylic resin manufactured by Hitachi Chemical Co., Ltd.) over the entire surface thereof by spraying and was dried, to form a moisture-proof coating layer consisting of one layer having a thickness of 80 μm. The electronic component packaging structure thus obtained was repaired similarly to Example 1. After being immersed in MEK for 10 minutes, the he electronic component packaging structure was taken out of the repairing solvent, and the moisture-proof coating layer was ruptured into fine pieces. It took 15 minutes to completely remove the moisture-proof coating layer in such a condition by means of tweezers. After peeling off, broken moisture-proof coating layer was scattered and discolored to black in the process of removing the BGA.

Example 2

The electronic component packaging structure 100 was made by an operation similar to that of Example 1, except for using a moisture-proof insulating material for circuit board Tuffy TF-1141T (registered trade mark of acrylic resin manufactured by Hitachi Chemical Co., Ltd.) as the component of the upper layer 1 of the coating material moisture-proof coating layer 10 to form the upper layer 1 having a thickness of 90 μm, then repairing operation was conducted. The lower layer 2 was formed from the TF-1141H (registered trade mark of acrylic resin manufactured by Hitachi Chemical Co., Ltd.) that is an acrylic resin, too. Molecular weights of the component of the upper layer 1 and of the component of the lower layer 2 were measured with a gel permeation chromatography (GPC), showing 33,500 for the component of the upper layer 1 and 8,900 for the component of the lower layer 2. The electronic component packaging structure 100 was immersed in the repairing solvent (MEK) for 10 minutes, and the polymer material of the upper layer 1 maintained the form of sheet without much swelling with the repairing solvent and rupturing. The polymer material of the lower layer 2, in contract, swelled and ruptured, with almost all broken pieces sticking onto the upper layer 1. As a result, the moisture-proof coating layer 10 could be easily removed by means of tweezers while the pieces of the lower layer 2 were stuck onto the upper layer 1, with the operation taking three minutes.

Example 3

A mounted circuit board was prepared similarly to Example 1, and the moisture-proof coating layer 10 was formed by using a urethane resin (UF-820 manufactured by Sanyu Rec Co., Ltd.). Main components polyol and polyisocyanate were mixed in proportions of 1:1, and applied to the circuit board. Then the circuit board was placed in an oven and cured the coating layer 10 at a temperature of 40° C. for 10 minutes, followed by acceleration of the curing process for the moisture-proof coating layer 10 on the surface thereof by blowing hot air of about 150° C. for 1 minute from a dryer onto the surface of the moisture-proof coating layer 10. This resulted in the moisture-proof coating layer 10 having total thickness of 120 μm.

Observation of the moisture-proof coating layer 10 thus formed in a section thereof under a microscope showed a portion of relatively high degree of curing located in the upper part of the moisture-proof coating layer 10 and a portion of relatively lower degree of curing located in the lower part of the moisture-proof coating layer 10, although the two parts could not be regarded as clearly distinguishable two layers. Degree of curing was measured by using a differential scanning calorimeter (DSC) on the upper part and the lower part of the moisture-proof coating layer 10, with the result showing the existence of two layer-like regions that had different degrees of curing along the direction of thickness of the moisture-proof coating layer 10.

The electronic component packaging structure 100 thus obtained was subjected to repairing operation similar to that of Example 1. A resin dissolving agent Dynasolve 711 (manufactured by Dynaloy Inc.) based on propylene glycol was used as the repairing solvent. The electronic component packaging structure was immersed in the solvent for 10 minutes before being taken out, showing the moisture-proof coating layer 10 remaining without much swelling in the portion near the surface thereof and swelling on the lower side. As a result, the moisture-proof coating layer 10 could be easily removed from the circuit board 3 by means of tweezers similarly to Example 1, with the operation taking about five minutes.

Comparative Example 2

A mounted circuit board was prepared similarly to Example 1, and the moisture-proof coating layer was formed by using a urethane resin (UF-820 manufactured by Sanyu Rec Co., Ltd.). Main components polyol and polyisocyanate were mixed in proportions of 10:7, and applied to the mounted circuit board. Then the circuit board was evenly heated in an oven and cured at 40° C. thereby to cure the moisture-proof coating layer consisting of a single film of a urethane resin, resulting in a coating film having a thickness of 130 μm. The moisture-proof coating layer of the electronic component packaging structure thus obtained was peeled off by using a repairing solvent similar to that of Example 3, and the entire moisture-proof coating layer showed swelling and brittleness. Thus the moisture-proof coating layer could not be peeled off as an integral sheet, and the broken pieces stuck to the circuit board and the electronic components. It took about 18 minutes to remove the broken pieces of the moisture-proof coating layer by means of tweezers.

Example 4

A mounted circuit board was prepared similarly to Example 1, and the moisture-proof coating layer 10 was formed by using a mixture of UV-curing resin UV-580 (manufactured by Sanyu Rec Co., Ltd.) and 5% by weight (2.4% by volume) of crushed silica FS (manufactured by Denki Kagaku Co., Ltd.) serving as an insulating filler that blocks UV for forming the lower layer 2 by printing, and using a mixture with 25% by weight (16.2% by volume) of the silica FS for forming the upper layer 1 by printing. The moisture-proof coating layer was irradiated with ultraviolet ray having wavelength of 300 to 400 nm by using a UV irradiation apparatus of desk-top conveyor type (SEN LIGHTS CORPORATION).

Observation of the moisture-proof coating layer 10 thus formed in a section thereof under a microscope showed the formation of two layers; an upper layer 1 of relatively high crosslink density and a lower layer 2 of relatively low crosslink density. Total thickness of the moisture-proof coating layer 10 was about 150 μm. The electronic component packaging structure 100 thus obtained was subjected to repairing operation similar to that of Example 1. The upper layer 1 maintained the sheet configuration, while the lower layer 2 ruptured and almost all of the broken pieces stuck to the upper layer 1. As a result, the moisture-proof coating layer 10 could be easily removed from the circuit board 3 while the broken pieces of the lower layer 2 stuck onto the upper layer 1, by means of tweezers with the operation taking five minutes.

Comparative Example 3

A mounted circuit board was prepared similarly to Example 1, and the moisture-proof coating layer was formed by using UV-curing resin (UF-580 manufactured by Sanyu Rec Co., Ltd.). A coating film 80 μm in thickness was formed by spraying without adding an insulating filler that blocks irradiation. The coating film was cured by irradiation similarly to Example 4, so as to form the single layer coating film over the electronic components. The electronic component packaging structure thus obtained was repaired similarly to Example 4. The entire moisture-proof coating layer swelled when immersed in repairing solvent, but was difficult to peel off from the electronic components or the circuit board, and it took 15 minutes to remove the coating and clean the remainder.

Example 5

A mounted circuit board and the lower layer 2 of the moisture-proof coating layer 10 were formed similarly to Example 1. With a mask having a plurality of blocking portions φ1 mm in diameter placed on the lower layer 2, the same material for the upper layer 1 as that of Example 1 was sprayed and cured. As shown in FIG. 2, this resulted in through holes 7 measuring φ1 mm in diameter formed in a plurality of positions of the upper layer 1 of the moisture-proof coating layer 10 in correspondence to the blocking portions φ1 mm in diameter formed at plurality of positions of the mask. The electronic component packaging structure 100a thus obtained was subjected to repairing operation similar to that of Example 1. The moisture-proof coating layer that was immersed in the solvent for 4 minutes swelled to an extent comparable to that the moisture-proof coating layer 10 that was immersed for 10 minutes in Example 1. The operation of peeling off the moisture-proof coating layer 10 could be easily completed in about 3 minutes, leaving clean surface.

Example 6

The electronic component packaging structure 100b was prepared in a procedure similar to that of Example 1, except for mounting Quad Flat Package (QFP) measuring 15 mm square instead of BGA as the semiconductor device 4 on the circuit board 3 and providing passing holes 8 measuring 2 mm in diameter in the circuit board 3 at positions below the centers of the QFP. The electronic component packaging structure 100b had the coating layer 10 similar to that of Example 1. The electronic component packaging structure 100b thus obtained was subjected to repairing operation similar to that of Example 1. The moisture-proof coating layer that was immersed in the solvent for 4 minutes swelled to an extent comparable to that of the moisture-proof coating layer 10 that was immersed for 10 minutes in Example 1. The operation of peeling off the moisture-proof coating layer 10 could be easily completed in about 3 minutes, leaving clean surface.

The results of Examples 1 to 6 and Comparative Examples 1 to 3 are shown in Table 2. Evaluations were conducted as follows.

Insulation resistance: After forming the moisture-proof coating layer on JIS comb type II circuit board, voltage of 100V was applied for 60 seconds and then insulation resistance was measured with a megger (insulating-resistance tester) 3458A manufactured by Agilet Technologies.

Repairing time Time (in minutes) taken to peel off the moisture-proof coating layer from the circuit board taken out of the repairing solvent after immersion.

Repairability: Repairing time was ranked in three levels (less than 5 minutes, 5 minutes or longer and less than 10 minutes, and 10 minutes or longer), and the ease of peeling off the moisture-proof coating layer ranked in two levels (easy to peel, difficult to peel). Repairability was evaluated in five levels by combining these two factors as shown in Table 1. The smaller the figure, the better the repairability is. Repairability of 3 or less was regarded as showing good performance.

TABLE 1

|  | Repairing Time | | |
| --- | --- | --- | --- |
|  | less than 5 min. | 5 min. or longer and less than 10 min. | 10 minutes or longer |
| easy to peel | 1 | 3 | 5 |
| difficult to peel | 2 | 4 | 5 |

TABLE 2

|  | Insulation Resistance (Ω) | Repairing Time (min.) | Repairability (5 levels, level 1 is the best) |
| --- | --- | --- | --- |
| Example 1 | $1.5 \times 10^{13}$ | 3 | 1 |
| Example 2 | $6.7 \times 10^{11}$ | 3 | 2 |
| Example 3 | $3.4 \times 10^{10}$ | 5 | 3 |
| Example 4 | $1.8 \times 10^{13}$ | 5 | 3 |
| Example 5 | $4.5 \times 10^{12}$ | 3 | 1 |
| Example 6 | $1.5 \times 10^{13}$ | 3 | 1 |
| Comparative Example 1 | $2.1 \times 10^{12}$ | 15 | 5 |
| Comparative Example 2 | $4.3 \times 10^{10}$ | 18 | 5 |
| Comparative Example 3 | $3.6 \times 10^{13}$ | 15 | 5 |

All Examples showed good performance with insulation resistance of $1 \times 10^9$ or higher, short repairing time not longer than five minutes and repairability of level 3 or better.

The present invention provides the electronic component packaging structure that can be used effectively as electronic component packaging structure having the moisture-proof coating layer when there is no need of repair, and allows it to separate the moisture-proof coating layer of two-layer structure as a single piece from the circuit board and peel off the moisture-proof coating layer from the circuit board efficiently so as to minimize the remainder of the moisture-proof coating layer left on the circuit board, while being capable of suppressing the failure rate of electronic components that are mounted again. Thus the electronic component packaging structure can be advantageously used in the field of electronic components where there is a need of repairing for moisture-proof coating.

What is claimed is:
1. An electronic component packaging structure comprising:
 a circuit board;
 electronic components mounted on the circuit board; and a moisture-proof coating layer covering the electronic components, wherein the moisture-proof coating layer includes at least two layers of polymer material coating, the at least two layers including a lower layer and an upper layer, and the polymer material forming the lower layer has at least one of a higher swelling property and a higher solubility to a repairing solvent than the polymer material forming the upper layer, and wherein the polymer materials forming the lower layer and the upper layer are a radiation-curable resin, the radiation-curable resin containing one or more kinds of fillers that are capable of blocking radiation, and a filler density $F_B$ of the lower layer is higher than a filler density $F_A$ of the upper layer.

2. The electronic component packaging structure according to claim 1, wherein the molecular weight ($M_{WB}$) of the polymer material forming the lower layer and the molecular weight ($M_{WA}$) of the polymer material forming the upper layer satisfy the following relationship:

$$M_{WB} < M_{WA}.$$

3. The electronic component packaging structure according to claim 1 wherein the radiation-curable resin containing one or more kinds of fillers that are capable of blocking radiation are capable of blocking radiation that is ultraviolet ray or electron beam.

4. The electronic component packaging structure according to claim 1, wherein the degree of curing of the polymer material forming the lower layer is lower than the degree of curing forming the polymer material of the upper layer.

5. An electronic component packaging structure comprising:
a circuit board;
electronic components mounted on the circuit board; and
a moisture-proof coating layer covering the electronic components,
wherein the moisture-proof coating layer includes at least two layers of polymer material coating, the at least two layers including a lower layer and an upper layer, and the polymer material forming the lower layer has at least one of a higher swelling property and a higher solubility to a repairing solvent than the polymer material forming the upper layer, and
wherein a filler density $F_B$ of the lower layer and a filler density $F_A$ of the upper layer satisfy a relationship of $F_B - F_A > 5$.

6. An electronic component packaging structure comprising:
a circuit board;
electronic components mounted on the circuit board; and
a moisture-proof coating layer covering the electronic components,
wherein the moisture-proof coating layer includes at least two layers of polymer material coating, the at least two layers including a lower layer and an upper layer, and the polymer material forming the lower layer has at least one of a higher swelling property and a higher solubility to a repairing solvent than the polymer material forming the upper layer, and
wherein the upper layer has a through hole that penetrates the upper layer, so that the lower layer is exposed via the through hole.

7. An electronic component packaging structure comprising:
a circuit board;
electronic components mounted on the circuit board: and
a moisture-proof coating layer covering the electronic components,
wherein the moisture-proof coating layer includes at least two layers of polymer material coating, the at least two layers including a lower layer and an upper layer, and the polymer material forming the lower layer has at least one of a higher swelling property and a higher solubility to a repairing solvent than the polymer material forming the upper laver, an
wherein the circuit board has a passing hole that penetrates the circuit board through which the repairing solvent can pass.

* * * * *